United States Patent [19]

Wilson

[11] 4,068,189
[45] Jan. 10, 1978

[54] LINEAR OSCILLATOR FOR PROXIMITY SENSOR

[75] Inventor: Michael A. Wilson, Sarasota, Fla.

[73] Assignee: Electro Corporation, Sarasota, Fla.

[21] Appl. No.: 730,532

[22] Filed: Oct. 7, 1976

Related U.S. Application Data

[63] Continuation-in-part of Ser. No. 576,897, May 12, 1975, Pat. No. 4,001,718.

[51] Int. Cl.² ............... G01R 33/12; G08C 21/00
[52] U.S. Cl. ...................... 331/65; 324/208; 324/236; 331/117 R; 331/186; 340/258 C
[58] Field of Search ............ 331/65, 117 R, 168, 331/186; 324/34 D, 34 PS, 34 E, 34 GT; 340/258 C, 266

[56] References Cited

U.S. PATENT DOCUMENTS

| Re. 24,779 | 2/1960 | Elam | 331/64 |
|---|---|---|---|
| 3,609,580 | 9/1971 | Thompson et al. | 331/65 |
| 3,743,853 | 7/1973 | Dittman et al. | 307/116 |

Primary Examiner—Siegfried H. Grimm
Attorney, Agent, or Firm—Wegner, Stellman, McCord, Wiles & Wood

[57] ABSTRACT

A linear oscillator circuit has a resonant circuit which develops an oscillating voltage $V_R$ having an amplitude proportional to a distance between a conducting body and the resonant circuit located within a probe. A control power drive circuit coupled to the output of the resonant circuit switches a current through the resonant circuit during each period of oscillation of the voltage $V_R$. A reference current source is coupled to the control power drive circuit for drawing a current through the control power drive circuit and the resonant circuit. The magnitude of the current is equal to the magnitude of an independently established reference current. A detector circuit responsive to the value of the amplitude of oscillation may be provided to indicate the distance of the conductive body from the resonant circuit-containing probe.

7 Claims, 13 Drawing Figures

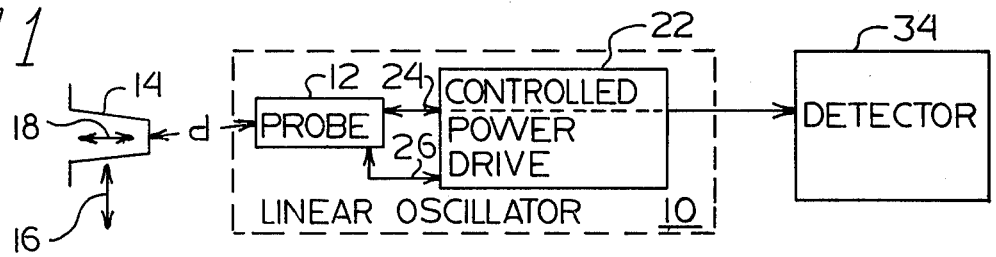
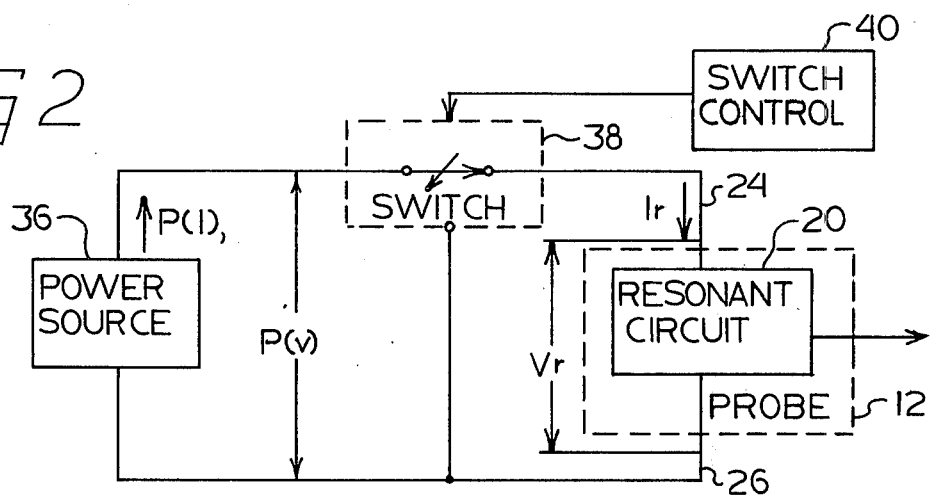
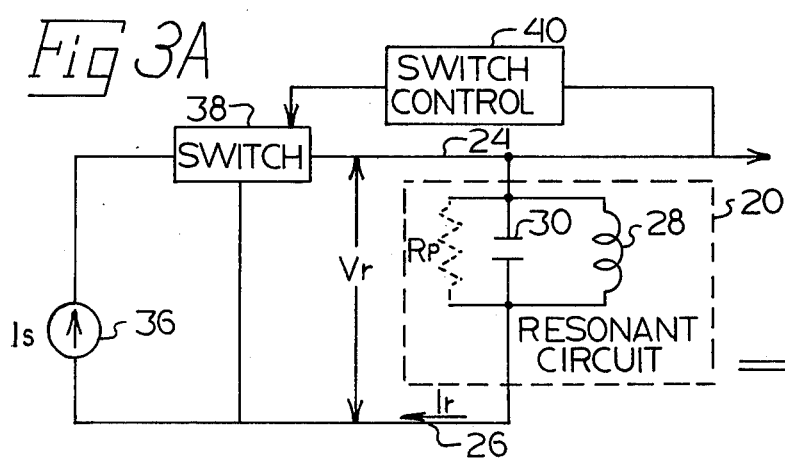
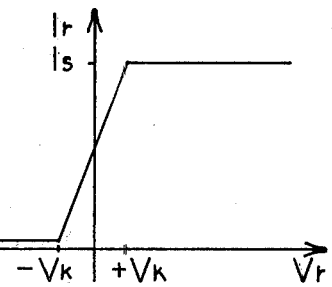
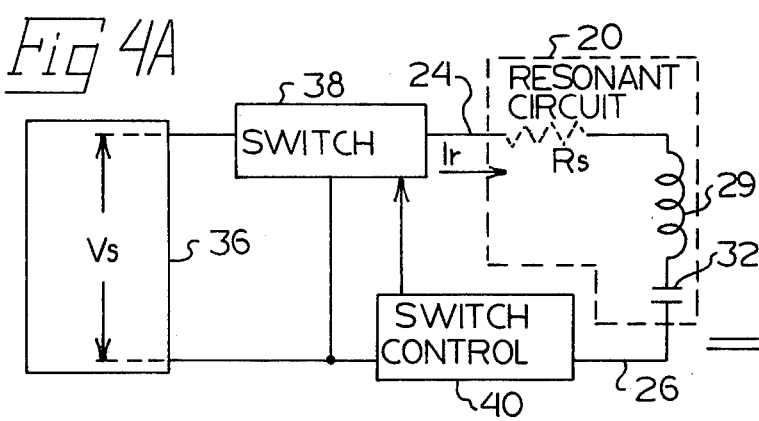
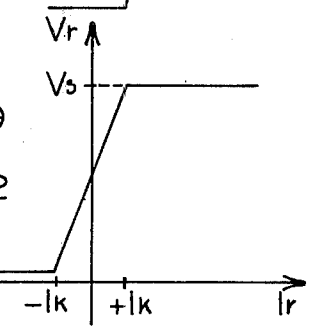

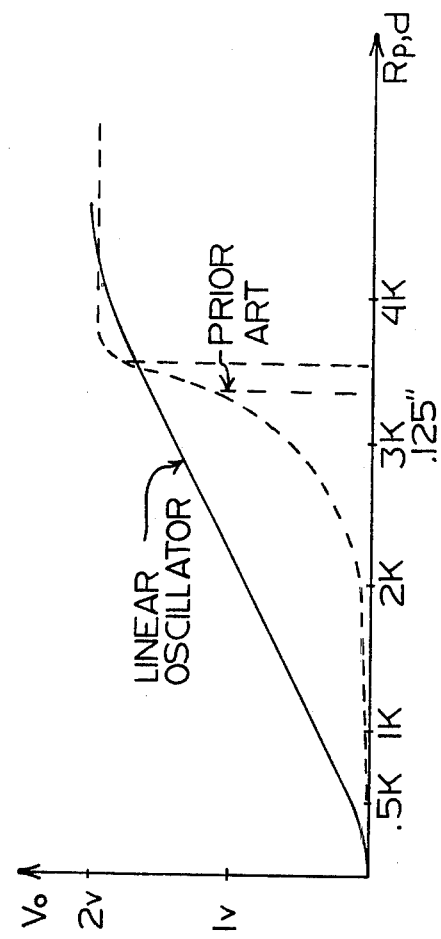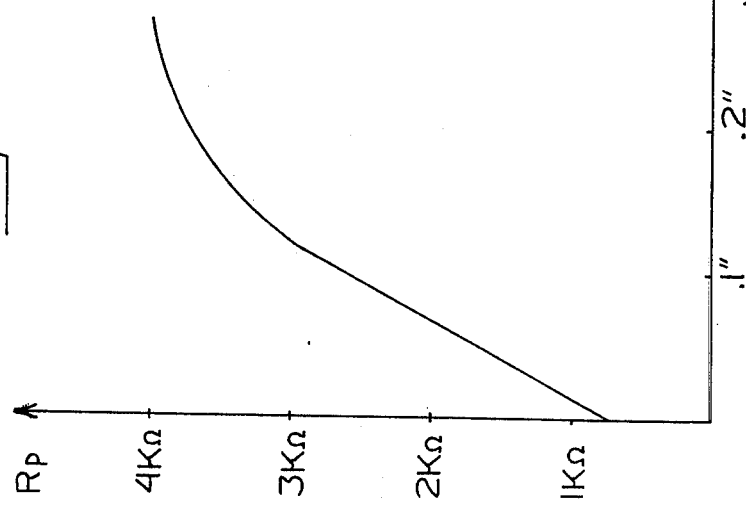

LINEAR OSCILLATOR FOR PROXIMITY SENSOR

RELATED APPLICATION

This application is a continuation-in-part of Ser. No. 576,897 filed May 12, 1975, now U.S. Pat. No. 4,001,718 and having a common assignee.

BACKGROUND OF THE INVENTION

This invention relates, generally, to a resonant circuit oscillator for a metal proximity sensor and, particularly, to a proximity oscillator of the type which produces an output with a peak amplitude that varies, as a function of target distance, the distance of a metal body or target from a probe containing a part of the resonant circuit.

Proximity sensors are known which utilize a resonant circuit oscillator having an output amplitude that varies in accordance with the distance between a conductive body and a probe containing a part of the resonant circuit. In such sensors, a level detector provides an output indication in response to the output oscillation assuming an amplitude corresponding to a selected distance.

Feedback oscillators of the Hartley or Colpitts type are commonly used which have an inductance coil of an LC resonant circuit contained in a probe. The transfer function of the feedback portion of the oscillator is established, in part, by the effective load impedance Q and power loss of the resonant circuit including the inductance coil of the probe. Within a certain range of distance from the probe, commonly less than an inch, eddy current losses in a metal body or target load the resonant circuit. This loading can be analytically expressed in terms of the effective parallel circuit resistance which varies directly with target distance or the effective equivalent series resonant circuit resistance which varies inversely with distance.

Movement of the target toward the probe decreases the effective parallel resistance and increases the power loss of the resonant circuit. Likewise, as the distance between the probe and the target increases, the effective parallel resistance of the resonant circuit increases and the power loss decreases.

In these feedback oscillators, the relationship between resonant circuit power loss and oscillator output amplitude is substantially nonlinear. For a range of relatively short distances between the probe and the target, the power losses of the resonant circuit are so high that the feedback loop gain is too low to sustain oscillations. Over this range of relatively short distances, changes in the resonant circuit power loss have virtually no effect on the output. When the power loss decreases to a value at which the loop gain is sufficiently high so that the oscillator amplifier enters its active region, oscillation amplitude increases with decrease in power loss. This relationship continues through the active region of the amplifier. Through a small portion of the active region of the amplifier, oscillator amplitude is linearly related to the inverse of power loss. Upon the power loss decreasing to the point where the amplifier reaches saturation, the peak output amplitude is achieved and further decreases in power loss have no effect. The nonlinearity of the oscillator output is due primarily to its feedback operation.

Nonlinearity of proximity sensors is due primarily to the oscillator, and not to probe characteristics. Many sensing probes have a linear relationship between the inverse of the power loss (or the effective resistance) and distance from a conductive body for a distance range which is substantially greater than the linear range of the oscillator. But most of the linear range of the probe cannot be advantageously employed because the oscillator is nonlinear.

The characteristics of feedback oscillators present a number of problems which detract from their utility in proximity sensor applications. The nonlinearity of the oscillator makes difficult calibrated adjustment of the relationship between output magnitude and distance. The feedback operation makes these known oscillators susceptible to temperature instability and mechanical noise problems.

The frequency response of these oscillators is also severely limited. The gain of the oscillator amplifier must often be kept low to maximize the linear range, and this degrades the frequency response of the oscillator. Oscillators of the Hartley and Colpitts type are easily loaded to the point where they cease to oscillate completely, and this further degrades the response time thereof.

Further, prior art sensors with oscillators of this type typically use as detectors level comparators with large amounts of hysteresis to cover up the instabilities in the oscillator. The wide excursions in oscillator voltage required for a level comparator with large amounts of hysteresis still further degrade the response time of the sensor.

SUMMARY OF THE INVENTION

The disadvantages of known proximity sensor oscillators are substantially overcome by the linear oscillator of the present invention in which the peak amplitude of oscillation varies linearly with the inverse of the power loss of a probe over a substantial range of distance. This advantageous result is achieved by periodically switching a power source having one fixed power component (i.e., current or voltage) to the resonant circuit so that the one component of the average input power to the resonant circuit is maintained at a constant magnitude. Unlike the known feedback oscillators, this one component of input power does not vary with changes in load, i.e., changes in the effective impedance and Q of the resonant circuit, or with changes in the value of the other power component which oscillates within the resonant circuit. Over a substantial portion of the linear range of the probe, peak amplitude of the other power component varies linearly with target distance.

The theory of operation is based principally on the fact that at steady state, with the resonant circuit oscillating at a constant amplitude, the power loss of the resonant circuit is equal to the power input to the resonant circuit. Power loss varies inversely with the effective parallel resistance or directly with the effective series resistance of the resonant circuit, respectively, depending upon whether the fixed component is current or voltage. Power loss also varies directly with the square of the oscillating power component. The input power is proportional to the product of the fixed component and the oscillating component, and because the one component is fixed and does not vary, the other component which is oscillating in the resonant circuit varies linearly with target distance over the linear range of the probe.

In one embodiment, a fixed voltage component is periodically applied across the resonant circuit in accordance with the phase of the oscillating current in the resonant circuit. The peak amplitude of the oscillating current component varies linearly with the inverse of the effective series resistance of the resonant circuit and thus linearly with target distance.

In another embodiment, a constant current is periodically applied to the resonant circuit in accordance with the phase of the voltage component which oscillates within the resonant circuit. The oscillating voltage amplitude varies linearly with the effective parallel resistance of the resonant circuit, and thus linearly with target distance.

In a specific circuit embodiment of the current source form of the invention, a current mirror circuit provides a current to the resonant circuit having a magnitude equal to the magnitude of a reference current. A reference current source is connected in series with each of a pair of differential voltage control switches. One of the voltage control switches is connected in series between the reference current source and the input of the current mirror source and applies reference current thereto when in a conductive state. The other switch provides an alternate path for the reference current when the one switch is in a nonconductive state so that the reference current source is kept in a steady state condition. When the oscillating voltage amplitude exceeds a selected positive value, the one switch connected to the mirror circuit input is turned on to connect the reference current source to the mirror circuit input, and the other switch is turned off. When the oscillating voltage amplitude decreases below a second selected value, the one switch connected to the mirror circuit is turned off and the other switch providing the alternate path conducts the full amount of reference current therethrough.

In another specific embodiment, a precisely established current is drawn directly through the resonant circuit without the use of a current mirror circuit. The resonant circuit is coupled to a differential voltage control circuit having two current switches. The differential voltage control circuit is connected to a controlled current source. One switch in the differential voltage control circuit provides a series connection between the reference current source and the resonant circuit. The other switch of the differential voltage control circuit provides an alternate path for current flow when the series connected switch is nonconducting. The two paths are established to assure that the current through the resonant circuit will be kept at a constant value. By drawing the precisely established current directly through the resonant circuit, the mirror circuit of the previously described embodiment can be eliminated. Accordingly, this circuit does not rely upon the reflection of current and is therefore less affected by ambient temperature changes. Also, each of the two switches in the differential voltage control circuit employs a plurality of transistors to increase the switching time of the differential amplifier so that a more accurate control of the current through the resonant circuit takes place. The current control circuit establishes a reference current, which current is not drawn through the resonant circuit. The reference current determines the value of the current to be drawn through the resonant circuit and is equal in value to it.

An important feature of the linear oscillator is that different linear relationships between output voltage and resonant circuit effective resistance may be selected by varying the magnitude of the reference current source. Specifically, in the current source embodiment, for instance, the oscillating voltage amplitude is directly proportional to the reference current magnitude. Thus, by simply increasing the reference current magnitude, the distance corresponding to a given output voltage amplitude may be decreased.

A further feature of the linear oscillator is that a high output voltage will be provided in the event of an open probe, i.e., an open inductance coil condition, and a low output voltage will be provided in the unlikely event of an overload to the resonant circuit. Thus, these two conditions can be readily distinguished from one another. In the prior art sensor, a low output voltage results from the occurrence of either of these two conditions, and separate circuitry must be provided to distinguish between them.

Yet another feature of the invention is that the frequency response is only limited by the band pass of the resonant circuit. The response time of the oscillator is substantially equivalent to that of a simple low pass filter. Further, overload conditions, which degrade the response time and often occur in prior art oscillators, are substantially avoided.

Thus, it is a principal objective of the present invention to provide an oscillator of high frequency response for use in proximity and distance sensors which produces an output oscillation having a peak amplitude that varies linearly with target distance.

The foregoing features and advantages will become more apparent and further features and advantages of the linear oscillator will be disclosed in the description of the preferred embodiments and the drawing taken in conjunction therewith.

BRIEF DESCRIPTION OF THE DRAWING

The following description of the preferred embodiments will be given with reference to the drawing, in which:

FIG. 1 is a block diagram of the linear oscillator in combination with a detector as used to sense the distance between a conductive body and the oscillator probe.

FIG. 2 is a block diagram illustrating a general form of the linear oscillator;

FIG. 3A is a block diagram of an embodiment of the linear oscillator in which a current source is periodically switched to the resonant circuit;

FIG. 3B is a graph of the instantaneous output voltage $Vr$ versus input current $Ir$ of the resonant circuit of the linear oscillator of FIG. 3A;

FIG. 4A is a block diagram of another embodiment of the linear oscillator in which a voltage source is periodically switched to the resonant circuit;

FIG. 4B is a graph of output current $Ir$ versus input voltage $Vr$ of the resonant circuit of the linear oscillator of FIG. 4A;

FIG. 5 is a graph of target distance $d$, i.e., the distance of a probe from a conductive body versus the effective parallel resistance $Rp$ of a typical probe;

FIG. 6 is a graph of effective parallel resistance $Rp$ and target distance $d$ versus the peak output voltage $Vo$ of a typical probe as used with the linear oscillator of FIG. 3A, shown in solid line, and as used with an exemplary oscillator of the prior art, shown in broken line.

DESCRIPTION OF THE PREFERRED EMBODIMENTS

Figures 7, 8:
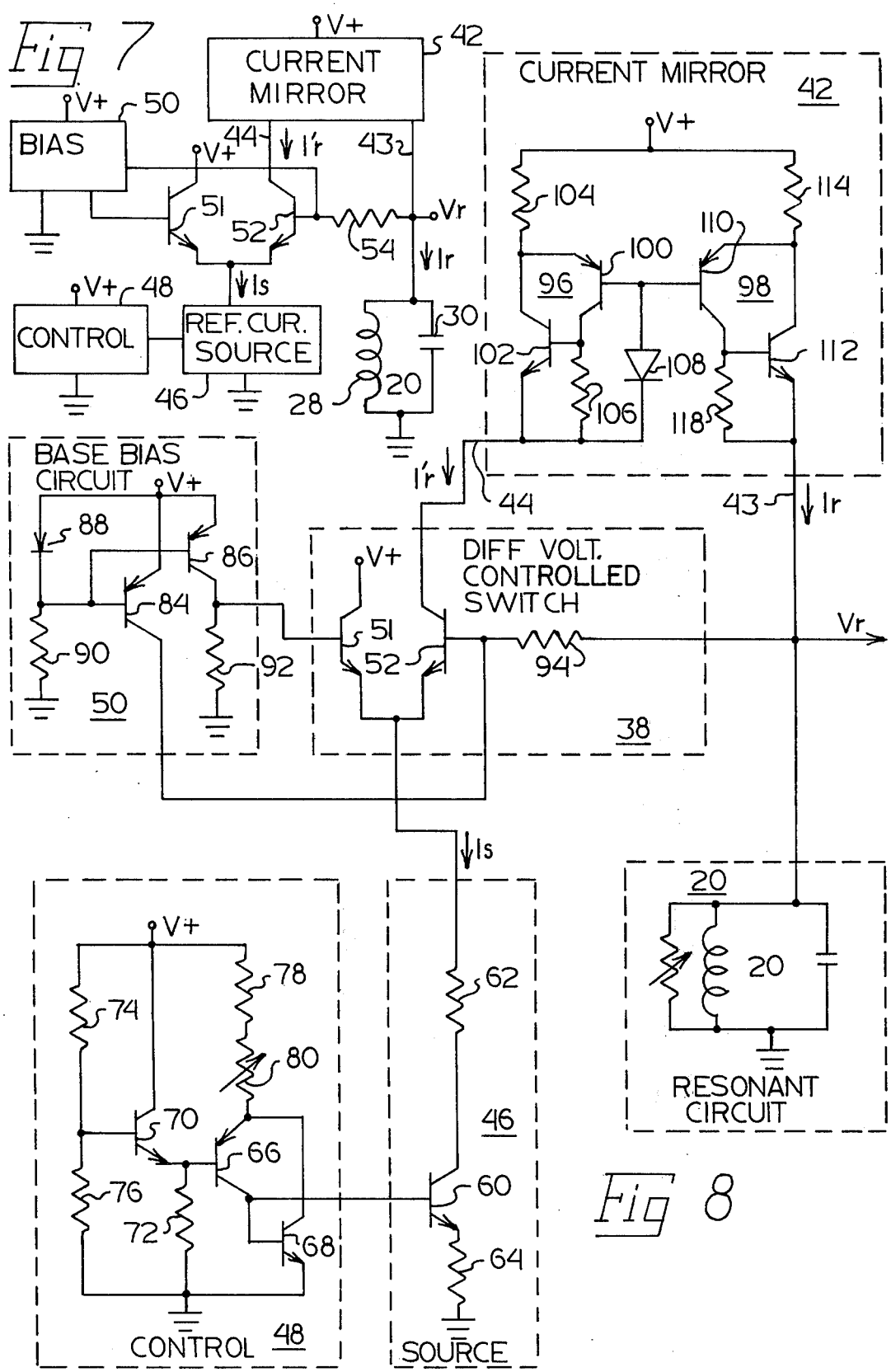
FIG. 7 is a detailed block diagram of a specific embodiment of the linear oscillator of the type shown FIG. 3A.
FIG. 8 is a circuit schematic of the linear oscillator shown in block diagram form in FIG. 7.

Referring to FIG. 1 of the drawing, the linear oscillator 10 is used in a sensor to measure a target distance $d$. The target distance $d$ is the distance between a probe 12 containing at least a part of a resonant circuit and a movable target 14 made from a conductive metal. The target distance $d$ may vary due to lateral movement of target 14 past the probe in the direction indicated by double-headed arrow 16, or may be the result of movement of the target 14 directly toward and away from probe 12 as indicated by the double-headed arrow 18. Target 14 may take various forms. For instance, movement of the target in the lateral direction 16 may be representative of movement of one of a plurality of equally spaced gear teeth on a rotating wheel.

Probe 12 typically comprises a suitable protective housing (not shown) containing at least a part of a resonant circuit 20, usually an inductance coil, as seen in FIG. 2. This part of the resonant circuit 20 is connected to a controlled power drive circuit 22 of the linear oscillator 10 through leads 24 and 26. In the LC resonant circuit shown in FIG. 3A, the inductor 28 is provided by an inductance coil of the probe, and the capacitor 30 connected in parallel therewith is partly representative of cable capacitance developed along the length of leads 24 and 26. The resonant circuit 20 may also be represented by an LC series resonant circuit having an inductor 29 and a capacitor 32 connected in series therewith as seen in FIG. 4A.

The controlled power drive circuit 22 periodically applies a source of power to the resonant circuit of probe 12 and an alternating current flows in the coil. The current sets up an alternating magnetic field around the coil 28 which in turn produces eddy currents in the metal target resulting in power losses in the resonant circuit. As the target distance decreases, resonant circuit power loss increases, and as the target distance $d$ increases, the power loss decreases. The power loss of the resonant circuit is represented by an effective parallel resistance $Rp$ of the parallel resonant circuit, FIG. 3A, and by an effective series resistance $Rs$ of the series resonant circuit, FIG. 4A. The effective parallel resonant circuit resistance $Rp$ varies directly with the target distance, and the effective series resonant circuit resistance $Rs$ varies inversely with target distance $d$. In fact, referring to FIG. 5 which is a graph of the effective parallel resistance $Rp$ of an exemplary probe as a function of target distance $d$, it is seen that the effective parallel resistance $Rp$ is linearly related to target distance $d$ over a range of target distance $d$ from zero to about 125 mils. Most sensor probes have a substantial linear range comparable to that shown in FIG. 5. The inverse of effective series resistance $Rs$ likewise varies linearly with target distance $d$ over a substantial range in most probes.

Referring now to FIG. 2, the controlled power drive circuit 22 is seen to comprise a power source 36 and means for switching the power source to the resonant circuit 20 to provide an average power thereto, including a switch 38 and a control circuit 40 therefor. Power source 36 provides to the resonant circuit 20 when switched thereto one of the current and voltage components of electrical power P(I) and P(V), respectively, at a magnitude that is substantially independent of the changes of load resistance to the power source and independent of the magnitude of the other power component. The control circuit 40 functions to cause the switch 38 to change periodically between one state in which the one power component is applied to the resonant circuit and another state in which the one power component is not applied to the resonant circuit. The power source is switched to the resonant circuit such that the average value of the one nonvarying component of input power remains substantially constant.

The resonant circuit 20 is a load to the source. Since the one component of input power is constant, the other component of input power, which oscillates within the resonant circuit, has a peak amplitude that varies with the effective resistance and power loss of the resonant circuit.

Specifically, the peak amplitude of oscillations produced in the resonant circuit is linearly related to the effective parallel resistance $Rp$ or the inverse of the effective series resistance $Rs$, respectively, depending upon whether the power source provides a constant current or constant voltage.

When the sensor is measuring distances within the linear range of the probe, the peak amplitude of the resonant circuit oscillations is linearly related to target distance $d$. This is illustrated in FIG. 6, which is a plot of a typical variation in peak voltage amplitude $Vo$ as a function of target distance $d$ and effective parallel resistance $Rp$ for the linear oscillator shown in FIG. 3A. The linear oscillator output, indicated in solid line, in seen to be linear over a substantial range. On the other hand, the output of a known feedback oscillator, indicated in broken line, is seen to be substantially nonlinear, having only a very narrow linear range which occurs when the feedback transfer function and oscillator amplifier are both in their linear range.

The remaining component of the sensor is a detector circuit 34 which may be of any suitable device responsive to the output amplitude of linear oscillator 10 to sense target distance. In its simplest form, detector 34 could comprise an amplitude meter having a scale graduated in terms of distance. Another suitable type of indicator may simply produce an output pulse in response to the amplitude exceeding a particular value corresponding to a selected distance.

Referring to FIG. 3A, a particular embodiment of the linear oscillator, in which power source 36 is a current source is shown. Power source 36 (in this embodiment of the linear oscillator) provides an output current having a selected amplitude $Is$, which is substantially independent of changes in load to the source. An oscillating voltage is developed in the resonant circuit having an instantaneous magnitude $Vr$ and a peak amplitude $Vo$. The source voltage $Vs$ is equal to the load voltage across the resonant circuit $Vr$ when current $Is$ is being applied thereto. At steady state, the peak voltage amplitude $Vo$ is constant. This occurs when the power input of the resonant circuit is equal to the power loss of the resonant circuit. When the current source 36 is periodically switched to the resonant circuit so that the average input current to the resonant circuit is substantially constant, the power input Pin to the resonant circuit is expressed by Equation 1.

$$P_{in} = K_1 I_s V_o \qquad 1.$$

where $K_1$ = constant
power loss $P_L$ is expressed by Equation 2.

$$P_L = V_o^2/2R_P \qquad 2.$$

Equating the expressions for Pin and $P_L$ and solving for the peak voltage amplitude Vo across the resonant circuit, an expression for Vo is obtained which is given by Equation 3.

$$V_o = 2K_1 I_s R_p \qquad 3.$$

As previously explained, the current amplitude Is of the power source is constant. Thus, it is seen from Equation 3 that the peak voltage amplitude Vo is directly proportional to the effective parallel resistance $R_p$ of the probe. Since over a range of target distance, the effective parallel resistance $R_p$ varies linearly with target distance, the peak voltage amplitude Vo is linearly related to target distance $d$ over that range.

If power source 36 provides current Is in only one polarity direction, then maximum power input and thus maximum peak voltage output for a given effective parallel resistance $R_p$ is achieved by controlling switch 38 so that the instantaneous current input Ir equals Is when Vr has a polarity of the same sense as that of Is, and Ir is equal to zero when Vr is of a polarity of the opposite sense of that of Is. That is, to achieve maximum input power, the current source is switched to the resonant circuit throughout each positive half wave of the oscillating voltage signal. As a practical matter, the ideal cannot normally be achieved due to switching offset characteristics of electronic devices used to perform this function. This might prevent the initial application of current to the resonant circuit necessary for oscillator start. Accordingly, a small linear region of current transition is provided about the zero value of Vr which ensures the application of current to the resonant circuit at zero voltage, as seen in FIG. 3B.

In the embodiment of the linear oscillator shown in FIG. 4A, power source 36 is a voltage source producing an output voltage having an amplitude Vs. This constant voltage is periodically switched across resonant circuit 20 through switch 38 to apply a nonzero average input power thereto. Application of the voltage Vs to resonant circuit 20 results in development therein of an oscillating current Ir having a peak amplitude Io. Switch control circuit 40 is responsive to the phase of the oscillating resonant circuit Ir, as indicated by the instantaneous amplitude thereof, to cause switch 38 to change states periodically such that the average value of input voltage to the resonant circuit remains substantially constant.

As with the current source embodiment of FIG. 3A, the average input power Pin is represented by Equation 4.

$$P_{in} = K_2 V_s I_o \qquad 4.$$

where $K_2$ = constant
The average power loss $P_L$ is expressed by Equation 5.
$$P_L = \tfrac{1}{2} R_s I_o^2 \qquad 5.$$

When a steady state condition is achieved, with the peak current amplitude being constant, Pin equals $P_L$. Thus, equating the respective expressions of input power and power loss respectively given by Equations 3 and 4, and solving the equation for the peak resonant circuit current amplitude Io, an expression for Io is obtained, given by Equation 6.

$$I_o = 2K_2 V_s(1/R_s) \qquad 6.$$

As can be appreciated from Equation 6, because Vs is a constant, the peak current amplitude will vary directly with the inverse of the effective series resistance Rs of the resonant circuit 20. The inverse of the effective resistance of the resonant circuit is directly proportional to the effective parallel resistance $R_p$, and thus is also directly proportional to the target distance $d$. Accordingly, within the linear range of probe, the current amplitude Io will vary linearly with target distance $d$.

As with the current source embodiment of FIG. 3A, maximum input power is transferred to the resonant circuit from a single polarity or DC voltage source when the voltage is applied throughout each alternate half wave of the oscillating current of a polarity of like sense of the voltage source polarity. Again, for practical reasons, this ideal cannot normally be achieved, and thus for a practical circuit, the transfer function provided by switch control circuit 40 and switch 38 is that shown in FIG. 4B. The switch 38 is operated to apply full power supply voltage Vs in response to the oscillating current assuming a first positive selected amplitude $+Ik$, and the power supply voltage Vs is substantially completely removed from the resonant circuit when the oscillating current decreases below a second selected amplitude $-Ik$ equal in magnitude to $+Ik$. Between these two selected values, the voltage varies directly with current to ensure oscillator start.

Referring now to FIGS. 7 and 8, a specific circuit embodiment for the current source form of the linear oscillator shown in FIG. 3A will be described. Referring first to FIG. 7, the controlled power drive circuit 22 for resonant circuit 20 operates to apply a current Ir periodically to the resonant circuit in accordance with the oscillating voltage Vr in the manner illustrated in the plot of voltage Vr versus current Ir shown in FIG. 3B. The input current Ir is applied to the resonant circuit 20 by a current controlled mirror circuit 42 through an output 43 thereof. The magnitude of Ir is controlled solely by the magnitude of a reference current Ir' applied to an input 44 of the current mirror circuit 42. Specifically, as will be explained in more detail below, the resonant circuit current Ir is equal to the control input current Ir'. Thus, the graph of Ir' as a function of Vr is identical to that of Ir shown in FIG. 3B.

The control current Ir' is applied to the current mirror circuit through a transistor switch 52 connected between a reference current source 46 and input 44. Reference current source 46 provides an output current having a substantially constant magnitude Is which is selected and regulated by a control circuit 48. Another transistor switch 51 connected in parallel with transistor switch 52 and current mirror circuit 42 and in series with reference current source 46 provides an alternate path for reference source current Is.

Reference source current Is is alternately conducted by transistor switches 51 and 52. A base bias circuit 50 provides base bias and drive to each of transistors 51 and 52 and also establishes the selected switching levels $-Vk$ and $+Vk$.

The value of reference input current Ir' is dependent upon the conductive state of transistor switch 52 which in turn is controlled by the magnitude of the instantaneous resonant circuit voltage Vr. The base of transistor 52 is connected to the resonant circuit 20 through a resistor 54. The base bias circuit 50 provides a base bias to transistors 51 and 52 such that transistor 52 is in cutoff at values of Vr less than $-$Vk and begins to conduct upon the oscillating voltage Vr exceeding $-$Vk, which may be approximately $-$50 millivolts. Due to base drive provided by bias circuit 50, transistor 52 is rapidly driven through its linear range and reaches saturation when the resonant circuit voltage Vr exceeds $+$Vk, approximately $+$50 millivolts. At saturation, the full magnitude of reference current Is is applied to input 44. At cutoff, virtually no current is applied to input 44.

As stated, the principal purpose of transistor 51 is to provide an alternate current path for reference current Is so that it may be maintained in a constant steady state value. As transistor 52 begins to turn off as the oscillating voltage decreases below $+$Vk, the transistor 51 begins to turn on and reaches saturation upon transistor 52 reaching cutoff. Likewise, as transistor 52 enters its linear region and then turns on in saturation, transistor 51 begins to turn off from saturation and enters its cutoff region upon transistor 52 reaching saturation. Referring to FIG. 2, transistor 52 being on and transistor 51 being off corresponds to the switch 38 shown in FIG. 2 being in the one position as shown connecting the source 36 to the resonant circuit and transistor 52 being off and transistor 51 being on corresponds to switch 38 being in the other position. Transistors 51 and 52 are matched transistors with regard to their switching characteristics insofar as that is possible, and between them conduct the full magnitude of Is at all times.

Circuit schematics of the functional circuit blocks of the linear oscillator illustrated in FIG. 7 are shown in FIG. 8. The reference current source 46 comprises an NPN transistor 60. Its collector is connected to the emitters of both transistors 51 and 52 through a resistor 62, and its emitter is connected through a resistor 64 to ground. The base of transistor 60 is provided with a fixed base current established by control circuit 48 of a magnitude in the active region of transistor 60. The base current establishes the magnitude of the reference current Is conducted through transistor 60.

Control circuit 48 is a series-regulated current source. Series regulation is provided by a PNP transistor 66 and an NPN transistor 68. The collector of transistor 68 is connected to the emitter of transistor 66, and the collector of transistor 66 is connected to the base of transistor 68 in a common configuration for series regulation. Base drive for source transistor 60 is taken from the junction between the collector of transistor 66 and the base of transistor 68. A fixed base drive to transistor 66 is provided by an NPN transistor 70 having its collector coupled directly to a DC voltage V$+$ and its emitter connected to ground through an emitter load resistor 72. The base input to transistor 66 is taken from the junction of emitter load resistor 72 and the emitter of transistor 70. Base bias for transistor 70 is taken from the junction between a pair of base bias resistors 74 and 76 connected between DC voltage V$+$ and ground.

A variable resistor 80 provides means for selectively altering the reference current Is, the resonant circuit drive current Ir and thus the linear relationship between peak voltage amplitude Vo and target distance d. The emitter of transistor 66 is coupled to DC voltage V$+$ through a fixed emitter load resistor 78 and variable resistor 80 connected in series therewith. By varying the value of resistor 80, the base drive to source transistor 60 is varied. In turn, this varies the magnitude of reference source current Is and reference input current Ir'. Increasing reference input current Ir' increases Ir and the peak voltage amplitude Vo corresponding to a given target distance d. Graphically, referring to FIG. 6, the slope of the peak voltage output curve as a function of target distance is directly proportional to the magnitude of Is.

Base bias circuit 50 includes a matched pair of PNP transistors 84 and 86, both of which are provided with base bias current from the junction between a diode 88 and a resistor 90 connected in series between DC voltage V$+$ and ground. The emitters of both transistors 84 and 86 are connected to DC voltage V$+$. The collector of transistor 86 is connected to the base of the alternate current path switch 51 and provides base drive thereto. The collector is also connected to ground through a base bias resistor 92 which functions as a collector load resistor for transistor 86. Transistor 84 has its collector connected to the base of reference current transistor 52 to provide base drive thereto. The base of transistor 52 is also connected to ground through a base resistor 94 of equal value to resistor 92 and the coil of resonant circuit 20.

When the instantaneous value of the resonant circuit voltage Vr is zero, the base drive to both transistors 51 and 52 is identical, and thus each transistor conducts one-half of reference source current Is. As Vs increases, however, base drive to transistor 52 from transistor 84 increases above that provided to transistor switch 51 from base bias transistor 86. This increases the share of reference source current Is carried by transistor 52, and decreases, by an equal amount, the share conducted by transistor 51. When Vr equals $+$Vk, transistor 52 is in saturation and transistor 51 is in cutoff such that all the reference source current Is is conducted by transistor 52 to input 44 of the mirror circuit 42 and substantially no current is conducted by transistor 51. When the resonant circuit voltage Vr decreases below 0 volts, just the opposite occurs.

The mirror circuit serves as the source of input current Ir to the resonant circuit 20. It comprises two virtually identical circuits: an input circuit 96 and an output circuit 98. Reference current Ir' is conducted through input circuit 96. Output circuit 98 provides on output 43 input current Ir to the resonant circuit having a magnitude substantially equal to reference current Ir'.

Input circuit 96 includes a PNP transistor 100 and an NPN transistor 102 connected therewith. PNP transistor 100 has its emitter connected to the collector of transistor 102 and its collector connected to the base of transistor 102. A resistor 104 connects the emitter of transistor 100 and the collector of transistor 102 to positive voltage V$+$. A second resistor 106 is connected between the base and emitter of transistor 102. Finally, input 44 is connected to the base of transistor 100 through a diode 108.

Output circuit 98 has a pair of transistors 110 and 112 and a pair of resistors 114 and 118 connected together with one another in identical fashion as transistors 96 and 102 and resistors 104 and 106 of input circuit 96 respectively. Transistors 100 and 110 and transistors 102 and 112 are respectively matched with regard to their characteristics. Resistor 104 has a value equal to that of resistor 114, and resistors 106 and 118 are likewise the same vaue.

The base of transistor 100 is connected with the base of transistor 110. Thus, the respective base emitter junctions of transistors 100 and 110 are connected in parallel and the voltage of each is identical. The emitter current through transistor 102 is established by the reference current $I_r'$ conducted through transistor 52 which in turn sets the collector current of transistor 100. A base drive to transistor 110 equal to that of transistor 100 is developed which corresponds to the emitter current of transistor 102. This results in an emitter current $I_r$ of transistor 112 substantially identical to reference current $I_r'$.

It should be understood that the invention is not limited to the specific circuitry shown in FIGS. 7 and 8 or to the transfer functions shown in FIGS. 3B and 4B. For instance, the current mirror circuit is provided merely to isolate the resonant circuit from transistor switch 52 so that the output voltage across the resonant circuit can be used to control the application of the current thereto. This same result will of course be achieved by connecting the resonant circuit in series with the switch as shown in FIG. 3A and utilizing some other form of isolation in the circuit to turn the switch on and off as required.

Figure 9:
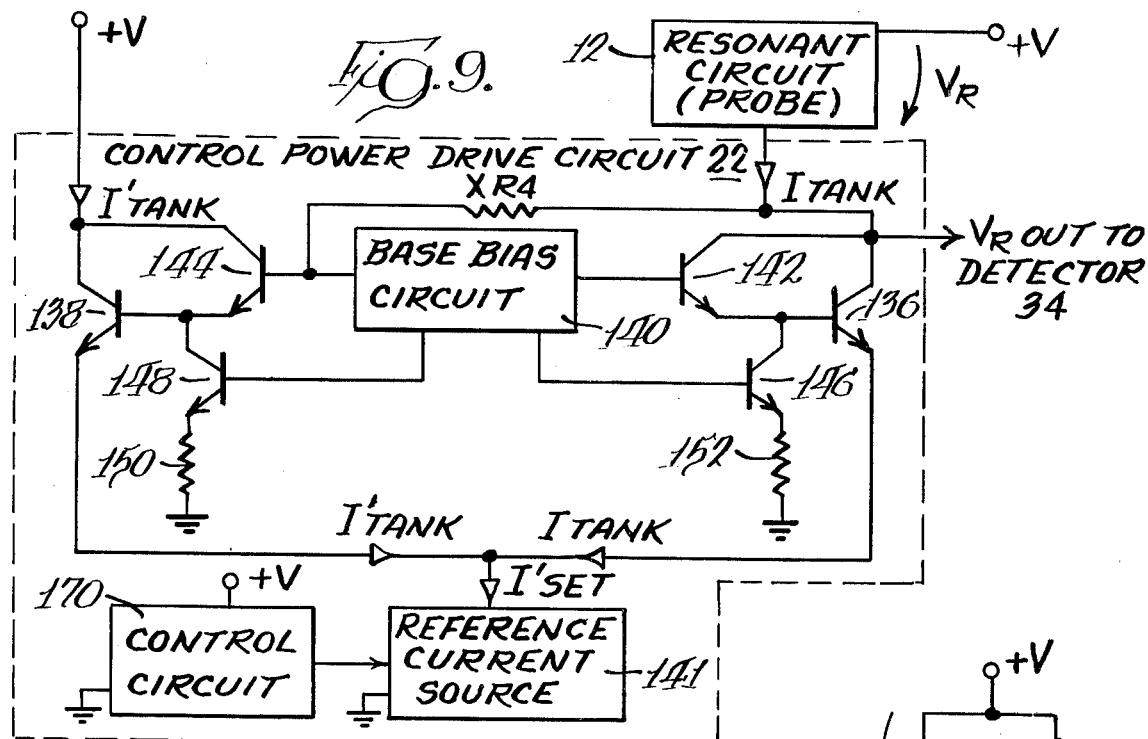
FIG. 9 is a diagram of another embodiment of the linear oscillator.

Referring to FIG. 9, another specific circuit embodiment for the current source form of the linear oscillator shown in FIG. 3(a) will be described. The control power driver circuit 22 for the resonant circuit 12 switches current $I_{tank}$ periodically through the resonant circuit in accordance with the oscillating voltage $V_R$ in a manner similarly illustrated in the plot of voltage $V_r$ versus $I_r$ in FIG. 3(b). One side of the tank circuit is connected to the voltage V+ and the other to the controlled power drive circuit 22. The voltage $V_R$ is taken across the tank circuit with respect to the voltage V+ and provided to detector 34 (FIG. 1).

The amount of current drawn through the resonant circuit 12, namely $I_{tank}$, is controlled by the current flow through transistor 136. When transistor 136 is forward-biased, current flow through it is effected. Transistor 136 is responsive to the value of the voltage $V_R$. Specifically, transistor 136 is in its nonconductive state when the voltage $V_R$ is positive with respect to V+ and is in its conducting state when $V_R$ is negative with respect to V+. Accordingly, $I_{tank}$ is drawn through transistor 136 during the negative half cycle of the oscillations as developed by the resonant circuit 12. During the positive half cycles of the oscillating voltage, that is, when $V_R$ is positive with respect to V+, transistor 136 is turned off and the current $I_{tank}'$ is drawn through transistor 138 while $V_R$ is negative with respect to V+ or during the half cycles of the oscillator. The oscillations from the resonant circuit 12 alternately provide the presence of $I_{tank}'$ and $I_{tank}$ through transistors 138 and 136, respectively. The value of $I_{tank}$ and $I_{tank}'$ are combined and together provide a constant current equal to $I_{set}'$. The value of $I_{set}'$ is determined by the reference current source 141. The linear relationship between $V_R$ and the distance of a conducting object from the resonant circuit is maintained because the current $I_{tank}$ is applied every half cycle so as to provide an average or constant value of current for each period. Hence, the value of $V_R$ is linearly related to the Q of the tank circuit which in turn is linearly related to the distance between the tank and the conducting object. It should be noted that the circuit shown in FIG. 9 does not rely upon the current mirror as used in FIGS. 7 and 8. The current mirror has been shown to be somewhat temperature-dependent, and at times improperly reflects $I_R$ as the ambient temperature changes.

Figure 10:
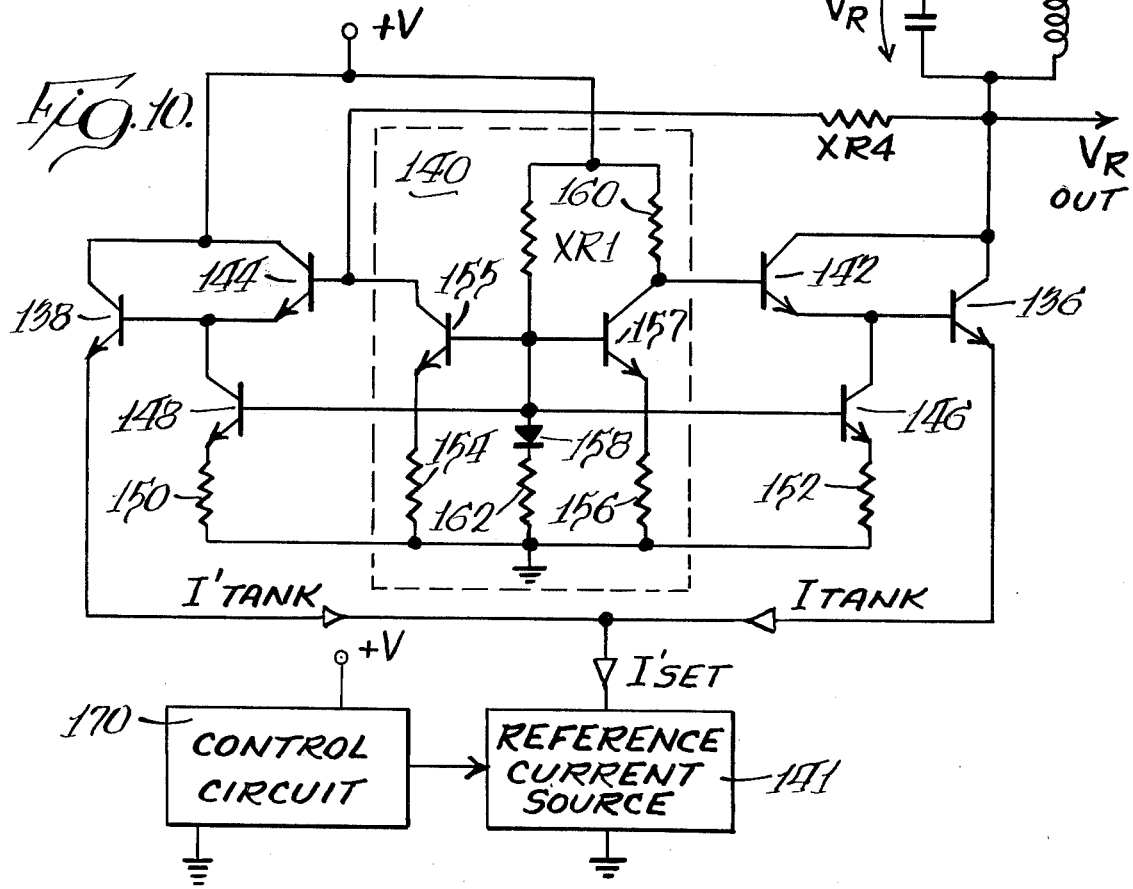
FIG. 10 is the circuit schematic of the base bias circuit and the resonant circuit of FIG. 9.

Referring to FIGS. 9 and 10, base bias circuit 140 controls the base of a differential voltage control switch which includes transistor pairs 136 and 142 and 138 and 144, as well as their corresponding speedup transistors 146 and 148. The base bias circuit 140 is provided $V_R$ information through resistor XR 4. Specifically, resistor XR 4 provides a voltage to the base bias circuit 140 and to the base of transistor 144 to assure turn-off of the transistor pair 138 and 144 when $V_R$ is less than approximately 0 volts.

As soon as an oscillator starting voltage is surpassed at the beginning of oscillation and steady state conditions are reached, transistors 142 and 136, as biased by the base bias circuit 140, draw the current $I_{tank}$ which at full magnitude equals the current $I_{set}'$ when $V_R$ is more negative than approximately 0.050 volts. Similarly, the current $I_{tank}$ is completely cut off when the value of $V_R$ becomes positive by an amount more than 0.050 volts and transistor pair 138 and 144 draw the current $I_{tank}'$. As transistors 138 and 144 respond to an increase in the instantaneous value of the oscillating voltage $V_R$ by turning on, transistors 136 and 142 begin to turn off and when they are completely cut off, transistors 138 and 144 draw the current $I_{tank}'$ which equals current $I_{set}'$.

Transistors 136 and 138 are matched transistors with regard to their switching characteristics, insofar as that is possible. Between them, they conduct the full magnitude of current $I_{set}'$ at all times. The condition of the transistor pair 136 and 142 being on and transistor pair 138 and 144 being off corresponds to the switch 38 in FIG. 2 being in the position of connecting the source 36 to the resonant circuit 20. When transistor pair 136 and 142 is off and transistor pair 138 and 144 is on, this condition corresponds to switch 38 in FIG. 2 being in the opposite position. The transistor pair 136 and 142 and the corresponding pair 138 and 144 operate to provide current therethrough without dependency upon base current conditions, as is the case with the circuit shown in FIGS. 7 and 8. Accordingly, the arrangement of the pair of transistors is more stable than that shown in FIGS. 7 and 8 and less prone to error therefore.

Transistors 146 and 148 are connected between their respective transistor pairs and provide for increased switching speed of the transistors which they control. The base of transistor 146 and the base of transistor 148 are coupled to the base bias circuit 140 so that they are biased at a level equal to that of the bases of transistors 155 and 157, respectively.

Base bias circuit 140 includes a matched pair of NPN transistors 155 and 157, the emitters of which are connected to biasing resistors 154 and 156, respectively. Both transistors are provided with a base bias current by diode 158. Resistor 162 matches diode 158 to transistors 155 and 157. The collector of transistor 157 is coupled to the base of transistor 142 and provides a base drive current thereto. Resistor XR 4 is coupled to the collector of transistor 155, as is the base of transistor 144. The collector of 155 provides a reference voltage at the base of transistor 144.

Figure 11:
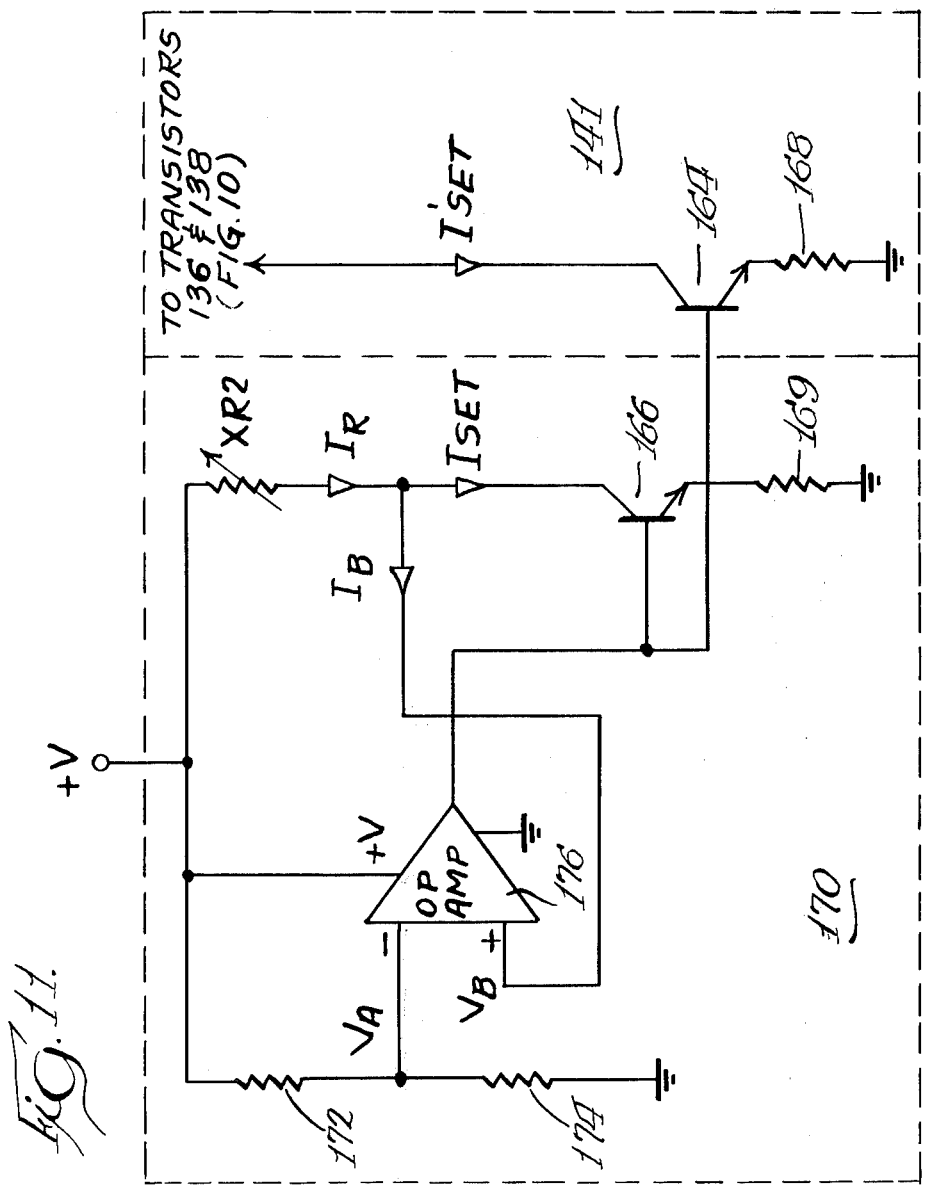
FIG. 11 is a circuit schematic of the control circuit and the reference current source of FIGS. 9 and 10.

Referring to FIG. 11, $I_{set}'$ is drawn through the reference current source transistor 164 and biasing resistor 168. The value of $I_{set}'$ is established and controlled by the control circuit 170. Specifically, $I_{set}'$ is forced to equal the value of $I_{set}$ and this equality is maintained at all times. The equal value of $I_{set}'$ and $I_{set}$ is apparent from FIG. 11 since the bases of transistors 164 and 166 are connected together and the value of resistor 169 is selected to equal the value of 168. Accordingly, the base emitter junctions of 164 and 166 are equally biased so that current through them is identical.

Current $I_{set}$ is established by the adjustment of resistor XR 2. Resistors 172 and 174 divide the voltage V+ so that approximately 0.6 (+V) appears at the positive input to the operational amplifier 176. The voltage to the positive input of the operational amplifier is denoted as $V_B$. $V_A$ denotes the voltage at the negative input terminal of the operational amplifier 176. The operational amplifier is responsive to the difference between $V_A$ and $V_B$, and forces $V_B$ equal to $V_A$. Accordingly, a voltage is established across resistor XR 2, the value of which is equal to the value of $V_A$. Therefore, the current $I_R$, as shown in FIG. 11, equals $(+V-V_B)/XR\ 2$. The current $I_{set}$ equals $I_R - I_B$. The input of the operational amplifier has a high beta and the current $I_B$ is extremely small. At balanced conditions, typical current $I_B$ is so small that $I_{set}$ essentially equals $(+V-V_A)/XR\ 2$ within 0.1%.

I claim:

1. A linear oscillator circuit comprising:
   a resonant circuit having an input and an output, the input coupled to a voltage V+, said resonant circuit being capable of developing an oscillating voltage $V_R$ having a peak amplitude which is directly proportional to a distance between the resonant circuit and a conducting body;
   a control power drive circuit coupled to the output of the resonant circuit for switching a current through the resonant circuit during each period of oscillation of the voltage $V_R$;
   a constant current source coupled to said control power drive circuit for drawing the current through said control power drive circuit and said resonant circuit wherein the magnitude of the current is equal to the magnitude of an independently established reference current; and
   a current control circuit coupled to the constant current source for establishing the independently established reference current.

2. The linear oscillator circuit as claimed in claim 1 further including:
   an alternate current path having an input and an output, the input thereof being coupled to the voltage V+ and the output being coupled to the constant current source so that the current is provided through the resonant circuit for substantially half the period of oscillation and through the alternate current path for the remainder of the period as switched by the control power drive circuit.

3. A linear oscillator circuit comprising:
   a resonant circuit having an input and an output, the input coupled to a voltage V+, said resonant circuit being capable of developing an oscillating voltage $V_R$ having a peak amplitude which is directly proportional to a distance between the resonant circuit and a conducting body;
   an alternate current path having an input and an output, the input coupled to a voltage V+;
   a control power drive circuit coupled to the output of the resonant circuit and to the output of the alternate current path for switching a current alternately through the alternate current path and the resonant circuit during each period of oscillation of the voltage $V_R$;
   a constant current source coupled to said control power drive circuit for providing a current through said control power drive circuit wherein the current is constant irrespective of the voltage $V_R$ and equal to an independently established reference current; and
   a current control circuit coupled to the constant current source for establishing the independently established reference current.

4. The linear oscillator circuit as claimed in claim 3 wherein the constant current source includes a first transistor having a base, a collector, and an emitter wherein the constant current flows through the collector and emitter thereof; and
   the current control circuit includes a second transistor having a base, a collector, and an emitter, wherein the independently established reference current flows through the collector and emitter thereof, wherein the first and the second transistors have similar intrinsic characteristics and the bases thereof are connected together and the emitters thereof are coupled together.

5. The linear oscillator circuit as claimed in claim 4 wherein the current control circuit further includes:
   a resistor coupled to the voltage V+ and to the collector of the second transistor wherein the independently established reference current flows through the resistor and is equal to, within 0.1%, the voltage across the resistor divided by its resistance.

6. The linear oscillator circuit as claimed in claim 5 wherein the voltage across the resistor can be adjusted thereby changing the value of the independently established reference current.

7. The linear oscillator circuit as claimed in claim 5 further including:
   an operational amplifier having a first and a second input and an output;
   a voltage divider network coupled to the first input of the operational amplifier, the second input connected between the resistor and the collector of the second transistor and the output of the operational amplifier coupled to the base of the first and the second transistors to maintain a constant voltage across the resistor.

* * * * *